(12) United States Patent
Otsuki

(10) Patent No.: US 6,436,772 B2
(45) Date of Patent: Aug. 20, 2002

(54) METHOD OF MANUFACTURING SEMICONDUCTOR DEVICE HAVING MEMORY CELL TRANSISTORS

(75) Inventor: Kazutaka Otsuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/875,050

(22) Filed: Jun. 7, 2001

(30) Foreign Application Priority Data

Jun. 8, 2000 (JP) .......................................... 2000-171897

(51) Int. Cl.[7] .......................................... H01L 21/8236
(52) U.S. Cl. ........................ 438/278; 438/290; 438/923
(58) Field of Search ................................ 438/128, 275, 438/276, 278, 289, 290, 291, 923

(56) References Cited

U.S. PATENT DOCUMENTS

| | | | | |
|---|---|---|---|---|
| 5,200,355 A | * | 4/1993 | Choi et al. ............... | 438/290 |
| 5,691,216 A | * | 11/1997 | Yen et al. ............... | 438/278 |
| 6,133,102 A | * | 10/2000 | Wu ........................... | 438/278 |
| 6,251,732 B1 | * | 6/2001 | Hsu .......................... | 438/278 |
| 6,297,102 B1 | * | 10/2001 | You et al. ................ | 438/278 |

FOREIGN PATENT DOCUMENTS

JP  5-283653  10/1993

* cited by examiner

*Primary Examiner*—Chandra Chaudhari
(74) *Attorney, Agent, or Firm*—Young & Thompson

(57) ABSTRACT

A plurality of diffusion layers extending in a first direction is formed at a surface of a semiconductor substrate in a cell region to be provided with the memory cell transistors. A plurality of gate electrodes extending in a second direction perpendicular to the first direction is formed on the semiconductor substrate in the cell regions. An interlayer insulating film is formed on the semiconductor substrate. A first resist film is formed on the interlayer insulating film. The first resist film is provided with openings in positions in alignment with regions between adjacent diffusion layers among the plurality of diffusion layers. a second resist film provided with openings previously designed in an arbitrary manner is formed on the first resist film. Then ions are implanted in the cell region using the first and second resist films as a mask.

15 Claims, 5 Drawing Sheets

METHOD OF MANUFACTURING SEMICONDUCTOR DEVICE HAVING MEMORY CELL TRANSISTORS

BACKGROUND OF THE INVENTION

1. Field of the Invention

The present invention relates to a method of manufacturing a semiconductor device having memory cell transistors such as a mask ROM (Read Only Memory), and more particularly, to a method of manufacturing a semiconductor device having memory cell transistors by a reduced number of manufacturing steps.

2. Description of the Related Art

FIG. 1A is a plan view of a mask ROM in a flat cell structure, and FIG. 1B is an equivalent circuit diagram of the mask ROM.

In the conventional flat cell type mask ROM, a plurality of $N^+$ diffusion layers are formed in a line-and-space pattern at a surface of a semiconductor substrate (not shown). A plurality of gate electrodes 2 are formed perpendicularly to the $N^+$ diffusion layers 1 also in a line-and-space pattern. The $N^+$ diffusion layer 1 and the gate electrode 2 are insulated from each other by an insulating film (not shown). There is a gate insulating film (not shown) between the gate electrodes 2 and the semiconductor substrate. Thus, a memory cell transistor having the gate electrode 2, the gate insulating film and two $N^+$ diffusion layers is formed. The surface region of the semiconductor substrate under the gate insulating film corresponds to the channel of the memory cell transistor.

A channel selected based on a request (requested design) by a customer is, for example, implanted with boron ions. The threshold value of the memory cell transistor having the channel increases. Thus, the mask ROM coding is performed. As a result, as shown in FIGS. 1A and 1B, a transistor 4a having a low threshold value and a transistor 4b having a high threshold value are formed. A mask used for implanting the boron ions is provided with an opening 3 designed based on the request by the customer as shown in FIG. 1A. The opening 3 is formed in a position in alignment with the channel of the transistor 4b having a high threshold value.

A conventional method of manufacturing the mask ROM will be now described in conjunction with FIGS. 2A to 2D. FIGS. 2A to 2D are sectional views showing steps in the conventional method of manufacturing the mask ROM in the order of steps. Note that FIGS. 2A to 2D are sectional views taken along line X—X in FIG. 1A.

The semiconductor substrate 5 is defined to a region A having memory cell transistors, and a region D having a peripheral circuit for writing/reading data to/from the memory cell transistors. The region D has a region B having an N-channel MOS transistor, and a region C having a P-channel MOS transistor.

As shown in FIG. 2A, in the region A, an $N^+$ diffusion layer 1 is formed at the surface of the semiconductor substrate 5. A gate oxide film (not shown) and a gate electrode 2 are formed on the semiconductor substrate 5. In the region B, an N-type diffusion layer 16 is formed at the surface of the semiconductor substrate 5, and a gate oxide film (not shown) and a gate electrode 2 are formed on the semiconductor substrate 5. In the region C, a P-type diffusion layer 7 is formed at the surface of the semiconductor substrate 5, and a gate oxide film (not shown) and a gate electrode 2 are formed on the semiconductor substrate 5. The gate oxide films or the gate oxide films are each formed at a time in some cases. Thereafter, an interlayer insulating film 6 is formed on the entire surface. The interlayer insulating film 6 is provided with a contact hole 6a extending to the N-type diffusion layer 16 and a contact hole 6b extending to the P-type diffusion layer 7.

As shown in FIG. 2B, phosphorus ions are implanted through the contact holes 6a and 6b. As a result, an $N^+$ diffusion layer 17 is formed at the surface of the N-type diffusion layer 16 and the P-type diffusion layer 7, and an N-channel transistor 11a is thus formed.

As shown in FIG. 2C, a photoresist film 8 to expose only the region C is formed. Boron ions are then implanted. As a result, a $P^+$ diffusion layer 9 is formed at the surface of the P-type diffusion layer 7 in place of the $N^+$ diffusion layer 17, and a P-channel transistor 11b is thus formed.

Then, the photoresist film 8 is removed, and a photoresist film 18 covering the region D is formed as a ROM code mask instead. As shown in FIG. 2D, the photoresist film 18 is provided with openings 3a corresponding to the openings 3 in FIG. 1A. More specifically, the openings 3a are formed based on the design of the openings 3. Then, boron ions are implanted through the openings 3a. As a result, code implantation layers 10 are selectively formed at the surface of the semiconductor substrate 5 in the region A. At the time, boron ions are not implanted into the transistors 11a and 11b.

Thereafter, the photoresist film 18 is removed, metal interconnections, bonding pads (not shown) and the like are formed to complete a semiconductor device.

In the mask ROM, the flat cell structure is mainly used as a cell corresponding to high density integration.

According to the above method (first prior art), cell transistors with a low threshold value are formed, and after the interlayer insulating film 6 is formed, a ROM code mask (photoresist film 18) having the openings 3a is formed according to the design. The ROM code mask is formed after the gate electrodes 2 are formed in some cases.

However, the patterns of the ROM code masks are different depending upon the code content. The pattern density, i.e., the density of the openings 3a is different among chips in a single product. Therefore, if the opening 3a has a pattern size as designed in a location with a low mask pattern density, the pattern size of the opening 3a in a location with a high mask pattern density becomes larger than the designed value. In the mask ROM shown in FIG. 1A, for example, a transistor 4a with a low threshold value located in the second row from the top and the second column from the left is surrounded by eight transistors 4b with a high threshold value, and therefore the size of the opening 3a for the transistor 4b is larger than designed. As a result, code implantation layers (P-type diffusion layers) 10 are formed wider than the designed value, so that the threshold value of the transistor 4a surrounded by the transistors 4b is larger than designed. Consequently, the transistor 4a adjacent to the transistor 4b with a high threshold value and the transistor 4a adjacent to the transistor 4a with a low threshold have different threshold values.

This is more noticeable as the distance between the memory cell transistors is reduced with the reduction of the element size. As the element size has been reduced, a fine pattern is necessary for the ROM code mask, so that a relatively expensive, high precision reticle requiring a long manufacturing period is necessary.

In the field of the mask ROM, reduction in TAT (Turn Around Time) is a significant object and the use of such a high precision reticle requiring a long manufacturing period is not desirable. Therefore, there is a demand for a new type ROM code mask.

A method directed to a solution to the difference in the size of the opening caused depending upon the pattern density of the ROM code mask is disclosed, for example, by Japanese Patent Laid-Open Publication No. Hei. 5-283653. The manufacturing method (second prior art) will be now described in conjunction with FIGS. 3A to 3E. FIGS. 3A to 3E are sectional views showing steps in the conventional method (second prior art) of manufacturing a mask ROM in the order of steps. FIGS. 3A to 3E are sectional views taken along line X—X in FIG. 1A.

As shown in FIG. 3A, in the region A, an $N^+$ diffusion layer 1 is formed at the surface of the semiconductor substrate 5 and a gate oxide film (not shown) and a gate electrode 2 are formed on the semiconductor substrate 5. In the region B, an N-type diffusion layer 16 is formed at the surface of the semiconductor substrate 5, and a gate oxide film (not shown) and a gate electrode 2 are formed on the semiconductor substrate 5. In the region C, a P-type diffusion layer 7 is formed at the surface of the semiconductor substrate 5, and a gate oxide film (not shown) and a gate electrode 2 are formed on the semiconductor substrate 5. Note that the oxide films or the gate electrodes are each formed simultaneously in some cases. Then, an interlayer insulating film 6 is formed on the entire surface. The interlayer insulating film 6 is provided with a contact hole 6a extending to the N-type diffusion layer 16 and a contact hole 6b extending to the P-type diffusion layer 7. The interlayer insulating film 6 is also provided with a contact hole 6a in alignment with the channel region in the region A.

As shown in FIG. 3B, phosphorus ions are implanted through the contact holes 6a, 6b, and 6c. As a result, an $N^+$ diffusion layer 17 is formed at the surface of the N-type diffusion layer 16 and the P-type diffusion layer 7, and an N-channel transistor 11a is thus formed.

As shown in FIG. 3C, a photoresist film 8 to expose only the region C is formed. Boron ions are then implanted. As a result, a $P^+$ diffusion layer 9 is formed in place of the $N^+$ diffusion layer 17 at the surface of the P-type diffusion layer 7, so that a P-channel transistor 11b is formed.

The photoresist film 8 is then removed and a photoresist film 18 covering the region D is formed as a ROM code mask. As shown in FIG. 3D, the photoresist film 18 is provided with openings 3a corresponding to the openings 3 in FIG. 1A. Boron ions are then implanted through the openings 3a. As a result, code implantation layers 10 are selectively formed at the surface of the semiconductor substrate 5 in the region A. At the time, boron ions are not implanted into the transistors 11a and 11b.

The photoresist film 18 is then removed and a photoresist film 19 covering the region D is formed. As shown in FIG. 3E, the photoresist film 19 is patterned to expose contact holes 6c. An insulating film 12 is then deposited by liquid phase growth to fill the contact holes 6c. Then, using the photoresist film 19 as a mask, the insulating film 12 is etched back, so that the surface level of the insulating film 12 coincides with the surface level of the interlayer insulating film 6.

The photoresist film 19 is then removed, metal interconnections, bonding pads (not shown) and the like are formed and a semiconductor device is thus completed.

According to the second conventional example, not only the photoresist film 18 but also the interlayer insulating film 6 serves as a ROM code mask. Therefore, ion implantation can be achieved through equal size openings.

According to the second conventional example, however, there must be four masks in total for the ROM coding and the following steps. In other words, there must be a mask for the ROM coding (photoresist film 18), a mask for filling the contact hole 6c with an insulating film (photoresist film 19), a mask for forming metal interconnections (not shown), and a mask for forming pads (not shown). This increases the number of steps and the manufacturing cost as well.

SUMMARY OF THE INVENTION

It is an object of the present invention to provide a method of manufacturing a semiconductor device having memory cell transistors with a reduced number of masks and reduced variation in the threshold values.

According to the present invention, a method of manufacturing a semiconductor device having memory cell transistors comprises: forming a plurality of diffusion layers extending in a first direction at a surface of a semiconductor substrate in a cell region to be provided with the memory cell transistors; forming a plurality of gate electrodes extending in a second direction perpendicular to the first direction on the semiconductor substrate in the cell regions; forming an interlayer insulating film on the semiconductor substrate; forming a first resist film on the interlayer insulating film; forming a second resist film provided with openings previously designed in an arbitrary manner on the first resist film; and implanting ions in the cell region using the first and second resist films as a mask. The first resist film is provided with openings in positions in alignment with regions between adjacent diffusion layers among the plurality of diffusion layers.

According to the present invention, variation in the threshold values can be suppressed regardless of the density of mask patterns.

DETAILED DESCRIPTION OF THE PREFERRED EMBODIMENT

Figure 1A:
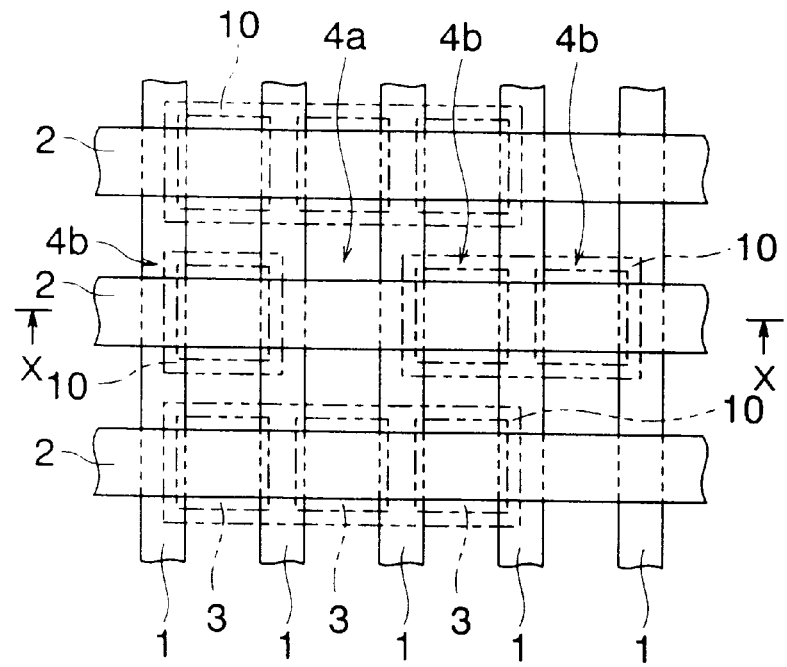
FIG. 1A is a plan view of a flat cell type mask ROM.
Figure 1B:
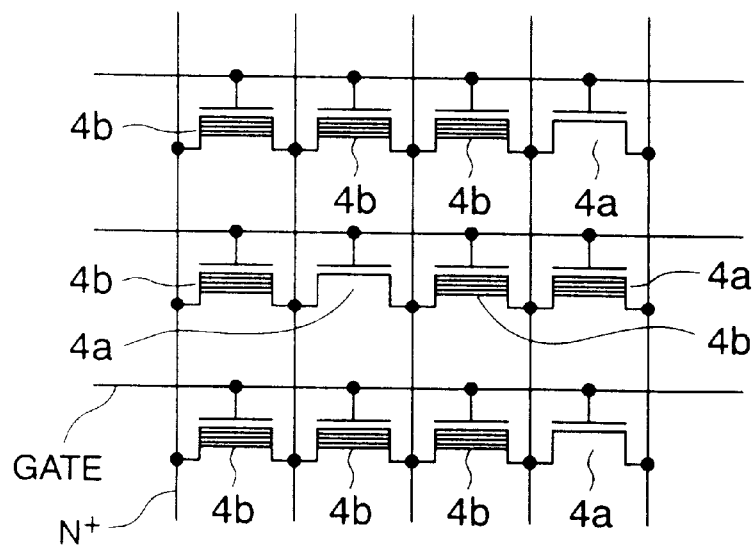
FIG. 1B is an equivalent circuit diagram of the mask ROM.
Figure 2A:
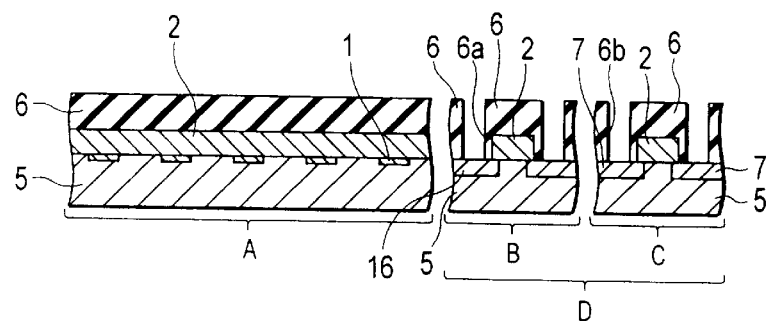
FIGS. 2A to 2D are sectional views showing steps in a conventional method of manufacturing a mask ROM (first prior art) in the order of steps.
Figure 2B:
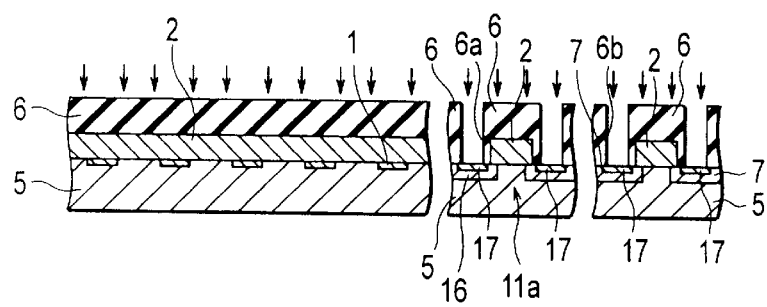
Figure 2C:
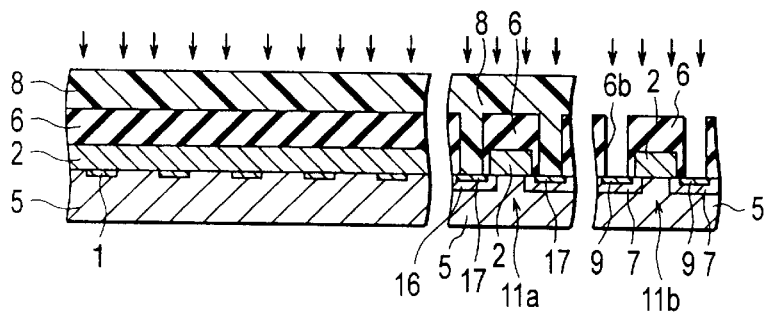
Figure 2D:
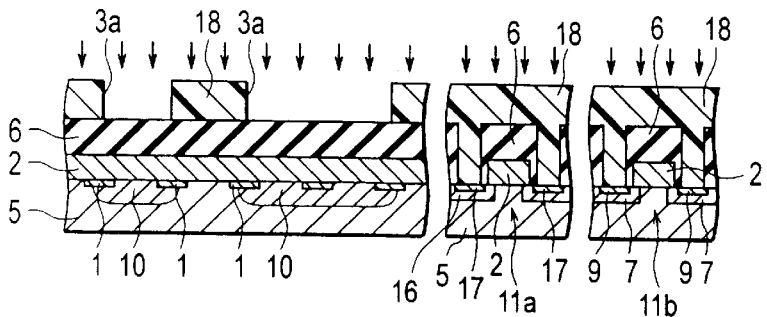
Figure 3A:
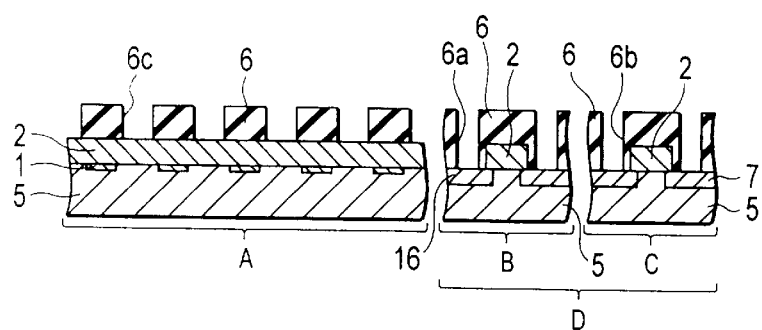
FIGS. 3A to 3E are sectional views showing steps in a conventional method of manufacturing a mask ROM (second prior art) in the order of steps.
Figure 3B:
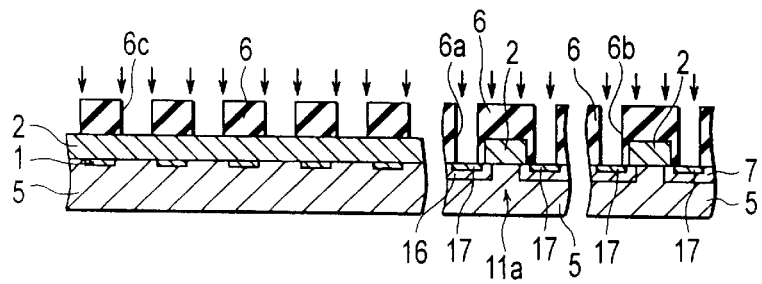
Figure 3C:
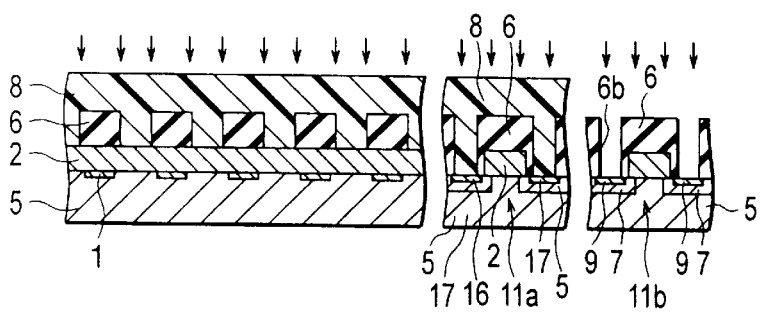
Figure 3D:
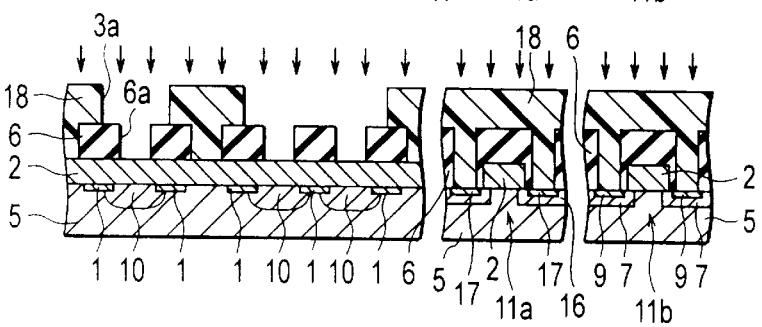
Figure 3E:
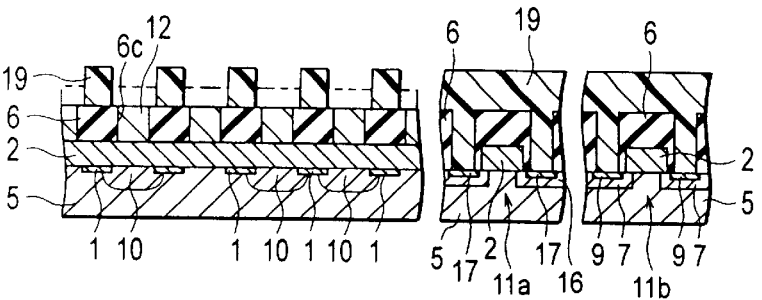

The preferred embodiments of the present invention will be now described in detail in conjunction with the accompanying drawings. FIGS. 4A to 4E are sectional views showing steps in a method of manufacturing a mask ROM according to a first embodiment of the present invention in the order of steps. FIGS. 4A to 4E are sections taken along line X—X in FIG. 1A.

Figure 4A:
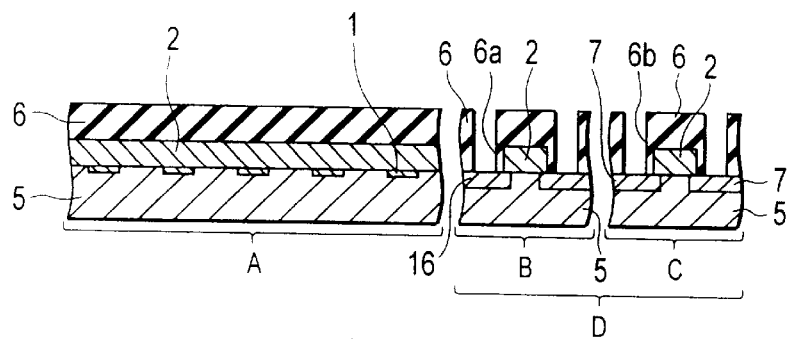
FIGS. 4A to 4E are sectional views showing steps in a method of manufacturing a mask ROM according to a first embodiment of the present invention in the order of steps.

As shown in FIG. 4A, an $N^+$ diffusion layer (impurity diffusion layer as a source/drain) 1 is formed at the surface of a semiconductor substrate 5 in a region A, and a gate oxide film (not shown) and a gate electrode 2 are formed on the semiconductor substrate 5. In a region B, an N-type diffusion layer (impurity diffusion layer as a source/drain) 16 is formed at the surface of the semiconductor substrate 5, and a gate oxide film (not shown) and a gate electrode 2 are formed on the semiconductor substrate 5. In a region C, a P-type diffusion layer (impurity diffusion layer as a source/drain) 7 is formed at the surface of the semiconductor substrate 5, and a gate oxide film (not shown) and a gate electrode 2 are formed on the semiconductor substrate 5. The gate oxide films or the gate electrodes may each be formed simultaneously. Then, an interlayer insulating film 6 is formed on the entire surface. The interlayer insulating film 6 is provided with a contact hole 6a extending to the N-type diffusion layer 16 and a contact hole 6b extending to the P-type diffusion layer 7.

Figure 4B:
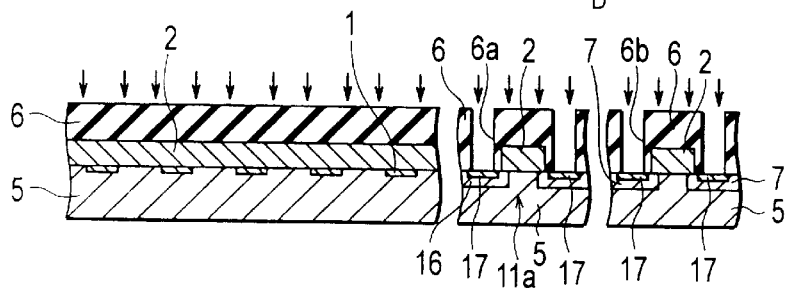

As shown in FIG. 4B, phosphorus ions, for example, are implanted through the contact holes 6a and 6b. As a result, an $N^+$ diffusion layer 17 is formed at the surface of the N-type diffusion layer 16 and the P-type diffusion layer 7, and an N-channel transistor 11a is formed.

Figure 4C:
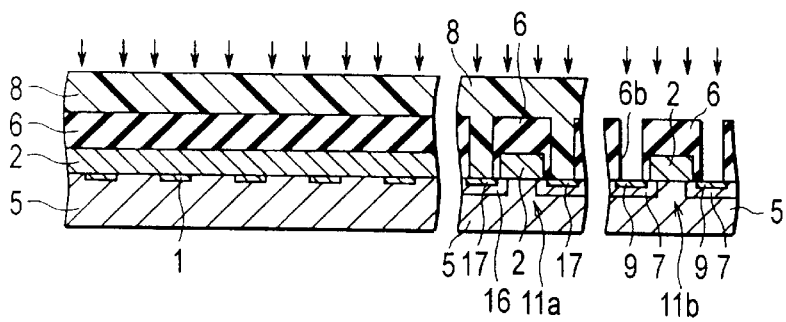

As shown in FIG. 4C, a photoresist film 8 to expose only the region C is formed. Boron ions, for example, are implanted. As a result, a $P^+$ diffusion layer 9 is formed in place of the $N^+$ diffusion layer 17 at the surface of the p-type diffusion layer 7, and a P-channel transistor 11b is formed.

Figure 4D:
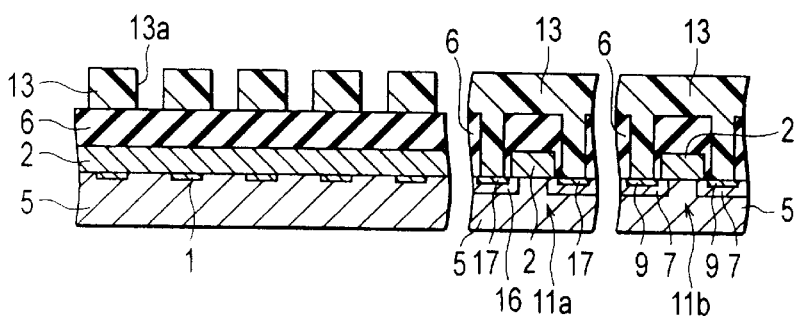

Then, the photoresist film 8 is removed, and a photoresist film (first resist film) 13 is deposited on the entire surface. The photoresist film 13 may be composed of, for example, photocuring resin. As shown in FIG. 4D, openings 13a in alignment with channel regions in the region A are formed in the photoresist film 13 by patterning. The photoresist film 13 is cured by heating and ultraviolet-ray.

Figure 4E:
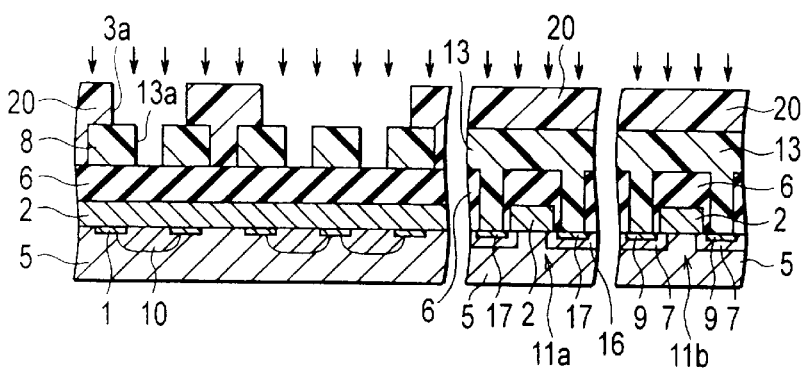

Then, a photoresist film (second resist film) 20 covering a region D is formed as a ROM code mask on the photoresist film 13. As shown in FIG. 4E, the photoresist film 20 is provided with openings 3a corresponding to the openings 3 in FIG. 1A. Boron ions, for example, are implanted through the openings 3a. As a result, code implantation layers 10 are selectively formed at the surface of the semiconductor substrate 5 in the region A. At the time, boron ions are not implanted into the transistors 11a and 11b.

Then, the photoresist films 20 and 13 are removed at a time, and metal interconnections, bonding pads (not shown) and the like are formed and a semiconductor device is completed.

According to the first embodiment, not only the photoresist film 20 but also the photoresist film 13 serves as a ROM code mask. More specifically, the opening 3a allows the opening 13a to be selectively exposed, while variation in the size of the opening 3a does not affect the element characteristics. Since the opening 13a is formed on the channel regions of all the memory cell transistors, the density is uniform. Therefore, there is little variation in the size of the opening 13a. As a result, variation in the size of the code implantation layer 10 is extremely scarce. The transistors 4a with a low threshold value have a threshold value substantially uniform regardless of whether it is surrounded by the transistors 4b with a high threshold value or not.

The steps required by the second prior art, i.e., the steps of forming an opening 6c in the interlayer insulating film 6, filling the opening 6c with an interlayer insulating film 12, and etching back the interlayer insulating film 12 are not necessary according to the present embodiment. Therefore, according to the present embodiment, the number of steps can be smaller than that of the second prior art. The number of masks is reduced by one as well. As a result, the TAT can be reduced.

Furthermore, the photoresist film 13 as an underlying mask for the ROM code mask and the photoresist film 20 as the ROM code mask can be removed at a time, and therefore the number of steps can be prevented from increasing.

A second embodiment of the present invention will be now described. FIGS. 5A to 5D are sectional views showing steps in a method of manufacturing a mask ROM according to the second embodiment of the present invention in the order of steps. FIGS. 5A to 5D are sectional views taken along line X—X in FIG. 1A.

Figure 5A:
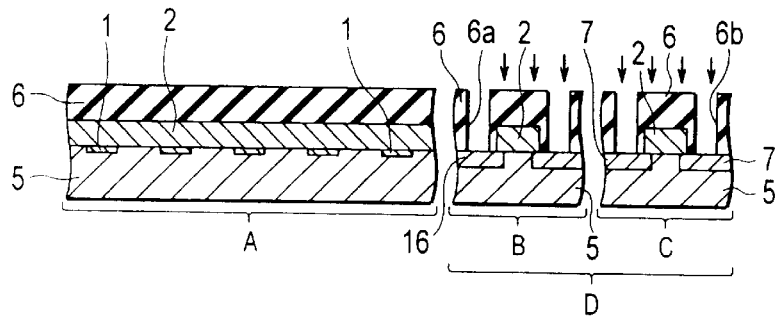
FIGS. 5A to 5D are sectional views showing steps in a method of manufacturing a mask ROM according to a second embodiment of the present invention in the order of steps.

As shown in FIG. 5A, an $N^+$ diffusion layer 1 is formed at the surface of a semiconductor substrate 5 in a region A, and a gate oxide film (not shown) and a gate electrode 2 are formed on the semiconductor substrate 5. In a region B, an N-type diffusion layer 16 is formed at the surface of the semiconductor substrate 5, and a gate oxide film (not shown) and a gate electrode 2 are formed on the semiconductor substrate 5. In a region C, a P-type diffusion layer 7 is formed at the surface of the semiconductor substrate 5, and a gate oxide film (not shown) and a gate electrode 2 are formed on the semiconductor substrate 5. Note that the gate oxide films or the gate electrodes may each be formed simultaneously. An interlayer insulating film 6 is then formed on the entire surface. The interlayer insulating film 6 is provided with a contact hole 6a extending to an N-type diffusion layer 16 and a contact hole 6b extending to the P-type diffusion layer 7.

Figure 5B:
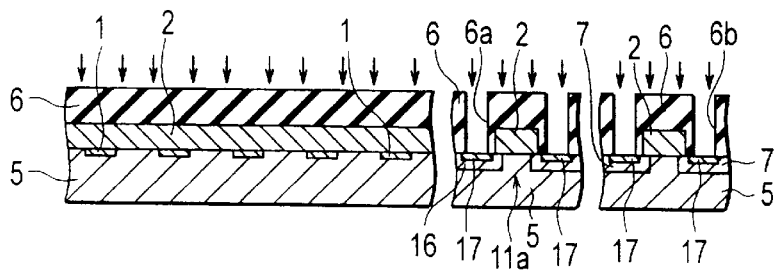

As shown in FIG. 5B, phosphorus ions, for example, are implanted through the contact holes 6a and 6b. As a result, an $N^+$ diffusion layer 17 is formed at the surface of the N type diffusion layer 16 and the P-type diffusion layer 7, and an N-channel transistor 11a is formed.

Figure 5C:
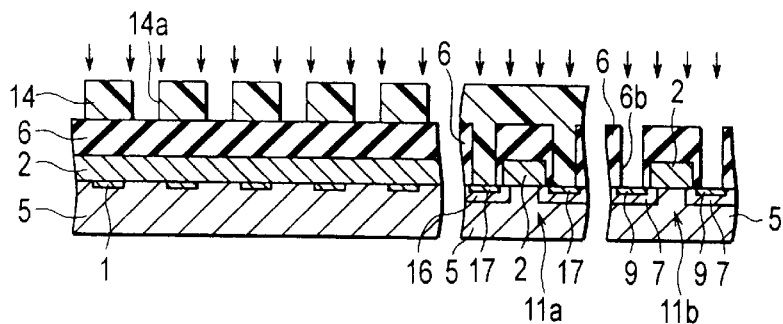

Then, as shown in FIG. 5C, a photoresist film (first resist film) 14 is formed on the interlayer insulating film 6. The photoresist film 14 may be, for example, composed of photocuring resin. Openings 14a are formed in the photoresist film 14 in alignment with the channel regions in the region and the photoresist film 14 in the region C is removed by patterning. As a result, the contact holes 6b is exposed. Boron ions, for example, are then implanted. A $P^+$ diffusion layer 9 is formed at the surface of the P-type diffusion layer 7 in place of the $N^+$ diffusion layer 17 as a result, and a P-channel transistor 11b is formed. At the time, the channel region in the region A is covered with the gate electrode 2 and the interlayer insulating film 6, so that boron ions are not implanted into the channel region in the region A. Then, the photoresist film 14 is cured by heating and ultraviolet-ray.

Figure 5D:
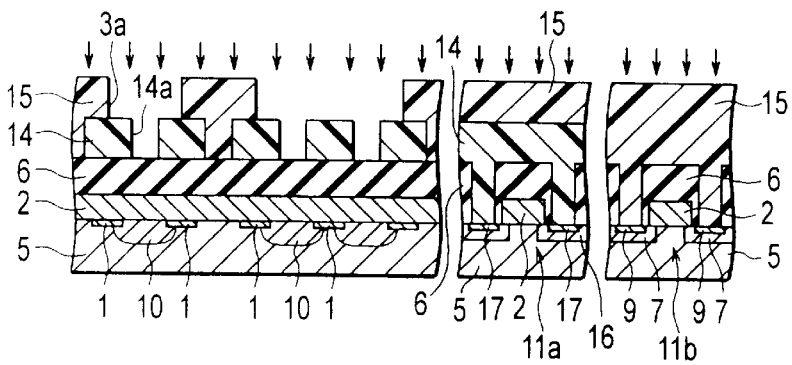

A photoresist film (second resist film) 15 covering a region D is then formed as a ROM code mask on the photoresist film 14. As shown in FIG. 5D, the photoresist film 15 is provided with openings 3a corresponding to the openings 3 in FIG. 1A. Boron ions, for example, are implanted through the openings 3a. As a result, code implantation layers 10 are selectively formed at the surface of the semiconductor substrate 5 in the region A. At the time, boron ions are not implanted into the transistors 11a and 11b.

Thereafter, the photoresist films 15 and 14 are removed simultaneously, metal interconnections, bonding pads (not shown) and the like are formed to complete a semiconductor device.

According to the second embodiment described above, not only the photoresist film 15 but also the photoresist film 14 serves as a ROM code mask, so that the same effects as those by the first embodiment can be provided. In addition, the photoresist film 14 may serve as a mask for ion implantation in the region C and therefore the number of masks can be reduced by one.

What is claimed is:

1. A method of manufacturing a semiconductor device having memory cell transistors, comprising the steps of:

forming a plurality of diffusion layers extending in a first direction at a surface of a semiconductor substrate in a cell region to be provided with said memory cell transistors;

forming a plurality of gate electrodes extending in a second direction perpendicular to said first direction on the semiconductor substrate in said cell regions;

forming an interlayer insulating film on said semiconductor substrate;

forming a first resist film on said interlayer insulating film, said first resist film being provided with openings in positions in alignment with regions between adjacent diffusion layers among said plurality of diffusion layers;

forming a second resist film provided with openings previously designed in an arbitrary manner on said first resist film; and implanting ions in said cell region using said first and second resist films as a mask.

2. The method according to claim 1, wherein said first resist film covers a part of a peripheral circuit region provided around said cell region.

3. The method according to claim 2, further comprising the step of implanting ions in said peripheral circuit region using said first resist film as a mask before implanting ions in said cell region.

4. The method according to claim 1, further comprising the step of curing said first resist film by heating and ultraviolet-ray after forming said first resist film.

5. The method according to claim 2, further comprising the step of curing said first resist film by heating and ultraviolet-ray after forming said first resist film.

6. The method according to claim 3, further comprising the step of curing said first resist film by heating and ultraviolet-ray after forming said first resist film.

7. The method according to claim 1, further comprising the step of removing said first and second resist films after implanting ions in said cell region.

8. The method according to claim 2, further comprising the step of removing said first and second resist films after implanting ions in said cell region.

9. The method according to claim 3, further comprising the step of removing said first and second resist films after implanting ions in said cell region.

10. The method according to claim 4, further comprising the step of removing said first and second resist films after implanting ions in said cell region.

11. The method according to claim 5, further comprising the step of removing said first and second resist films after implanting ions in said cell region.

12. The method according to claim 6, further comprising the step of removing said first and second resist films after implanting ions in said cell region.

13. The method according to claim 1, further comprising the steps of, after forming said interlayer insulating film:

forming a third resist film covering said cell region and exposing a part of a peripheral circuit region provided around said cell region; and implanting ions in said peripheral circuit region using said third resist film as a mask.

14. The method according to claim 4, further comprising the steps of, after forming said interlayer insulating film:

forming a third resist film covering said cell region and exposing a part of a peripheral circuit region provided around said cell region; and implanting ions in said peripheral circuit region using said third resist film as a mask.

15. The method according to claim 7, further comprising the steps of, after forming said interlayer insulating film:

forming a third resist film covering said cell region and exposing a part of a peripheral circuit region provided around said cell region; and implanting ions in said peripheral circuit region using said third resist film as a mask.

* * * * *